(12) United States Patent
Mulkens (10) Patent No.: US 9,417,519 B2
(45) Date of Patent: Aug. 16, 2016

(54) LITHOGRAPHIC APPARATUS, DEVICE MANUFACTURING METHOD, AND METHOD OF CORRECTING A MASK

(75) Inventor: Johannes Catharinus Hubertus Mulkens, Valkenswaard (NL)

(73) Assignee: ASML NETHERLANDS B.V., Veldhoven (NL)

( * ) Notice: Subject to any disclaimer, the term of this patent is extended or adjusted under 35 U.S.C. 154(b) by 845 days.

(21) Appl. No.: 13/438,491

(22) Filed: Apr. 3, 2012

(65) Prior Publication Data

US 2012/0257184 A1 Oct. 11, 2012

Related U.S. Application Data (60) Provisional application No. 61/472,935, filed on Apr. 7, 2011.

(51) Int. Cl.
*G03B 27/52* (2006.01)
*G03F 1/70* (2012.01)
*G03F 1/72* (2012.01)
*G03F 7/20* (2006.01)

(52) U.S. Cl.
CPC .. *G03F 1/70* (2013.01); *G03F 1/72* (2013.01); *G03F 7/7065* (2013.01); *G03F 7/70283* (2013.01)

(58) Field of Classification Search
CPC ......... G03F 1/70; G03F 1/72; G03F 7/70283; G03F 7/7065
USPC ................................................ 355/67, 77, 72
See application file for complete search history.

(56) References Cited

U.S. PATENT DOCUMENTS

| | | | |
|---|---|---|---|
| 6,605,799 B2 | 8/2003 | Brandinger et al. |
| 6,657,157 B1 | 12/2003 | Altman et al. |
| 6,929,886 B2 | 8/2005 | Zait et al. |
| 7,245,353 B2 | 7/2007 | Mulkens et al. |
| 7,303,842 B2 | 12/2007 | Watson et al. |
| 8,090,188 B2 | 1/2012 | Hiroshima |
| 2004/0207824 A1 | 10/2004 | Lof et al. |
| 2006/0077370 A1 | 4/2006 | Mulkens et al. |

(Continued)

FOREIGN PATENT DOCUMENTS

| | | |
|---|---|---|
| JP | H02-215118 | 8/1990 |
| JP | 08-174242 | 7/1996 |

(Continued)

OTHER PUBLICATIONS

Ute Buttgereit et al., "Process Window improvement on 45 nm technology Non Volatile Memory by CD uniformity improvement," Proc. of SPIE, vol. 7823, pp. 78230C-1-78230C-9 (2010).

(Continued)

*Primary Examiner* — Deoram Persaud
(74) *Attorney, Agent, or Firm* — Pillsbury Winthrop Shaw Pittman LLP (57) ABSTRACT

A lithographic apparatus includes a mask correction system configured to controllably and locally alter a property of a mask, for example transmissivity, transmissivity to a particular polarization state, birefringence and/or geometry. The mask correction system, in an embodiment, directs a beam of radiation onto a spot of the mask, the mask being scanned relative to the mask correction system. The mask correction system may include an arrangement to irradiate multiple 20 Claims, 3 Drawing Sheets

(56) References Cited

U.S. PATENT DOCUMENTS

| | | | |
|---|---|---|---|
| 2006/0118703 A1* | 6/2006 | Wegmann et al. | 250/216 |
| 2009/0020137 A1* | 1/2009 | Osawa | 134/1.3 |
| 2010/0231883 A1* | 9/2010 | Dodoc et al. | 355/67 |
| 2011/0279799 A1* | 11/2011 | Singer et al. | 355/53 |
| 2012/0224153 A1* | 9/2012 | Ehm et al. | 355/30 |

FOREIGN PATENT DOCUMENTS

| | | |
|---|---|---|
| JP | 2005-277153 | 10/2005 |
| JP | 2006-114904 | 4/2006 |
| JP | 2008-032827 | 2/2008 |
| JP | 2008-147314 | 6/2008 |
| JP | 2009-170458 | 7/2009 |
| JP | 2010-044287 | 2/2010 |
| JP | 2012-022323 | 2/2012 |

OTHER PUBLICATIONS

Guy Ben-Zvi et al., "Mask CD Control (CDC) with Ultrafast Laser for Improving Mask CDU Using AIMS™ as the CD Metrology Data Source," Proc. of SPIE, vol. 6730, pp. 67304X-1-67304X9 (2007).

Ulrich Neukirch et al., "Laser-induced birefringence in fused silica from polarized lasers," Proc. of SPIE, vol. 5754, pp. 638-645 (2005).

* cited by examiner

LITHOGRAPHIC APPARATUS, DEVICE MANUFACTURING METHOD, AND METHOD OF CORRECTING A MASK

This application claims priority and benefit under 35 U.S.C. §119(e) to U.S. Provisional Patent Application No. 61/472,935, entitled "Lithographic Apparatus, Device Manufacturing Method, and Method of Correcting a Mask", filed on Apr. 7, 2011. The content of that application is incorporated herein in its entirety by reference.

FIELD

The present invention relates to a lithographic apparatus, a device manufacturing method, and a method of correcting a mask.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/ or an aqueous solution.

SUMMARY

In a conventional lithography apparatus, the mask or reticle comprises a quartz sheet, referred to as the mask blank, on which the pattern to be imaged is formed in a chrome layer. The quartz is substantially transparent to the exposure radiation while the chrome layer is substantially opaque. The mask pattern may also include non-imaging features, such as optical proximity correction (OPC) features or serifs, that do not themselves image, but improve the pattern formed in resist in various ways. In some instances, the mask may be a phase-shift mask (e.g., an alternating phase-shift mask or an attenuated phase-shift mask) and thus the chrome layer may be substituted with a partially or substantially transparent layer on, or a partially or substantially transparent portion of, the mask blank different from the remainder of the mask blank in order to provide the pattern.

A pellicle may be used. This is a thin film of transparent material mounted on a frame attached to the mask at a small distance from the chrome layer to help prevent dust settling thereon. Dust particles settling on the pellicle will be out of focus when the mask is imaged.

A reflective mask for extreme ultraviolet (EUV) radiation comprises a rigid substrate on which is formed a multilayer stack of materials of alternating high and low refractive index. The multilayer stack forms a distributed Bragg reflector and is used to achieve a usable reflectance of the EUV radiation. The pattern is formed in a chrome layer on top of the multilayer stack.

Manufacture of masks takes a long time and is expensive, especially given that 30 or 40 masks are often used for the manufacture of a device. Masks are therefore carefully handled and inspected before use. Dust particles can be removed if necessary and small flaws in the chrome pattern can be mended, but more extensive errors or flaws involve remaking of the mask.

It has been proposed to make local adjustments of the transmissivity of the mask by selectively damaging it with a laser in order to control critical dimension (CD) uniformity. See the paper "Mask CD control with ultra fast laser for improving mask CDU", SPIE 6730 (2007). The process uses an ultra-fast femto-second laser to write intra-volume shading elements inside the bulk material of the mask. By adjusting the density of the shading elements, the radiation transmission through the mask is locally changed in a manner that improves substrate CDU when the corrected mask is printed. The process takes several hours to scan a standard size mask and is performed in a dedicated device.

It is desirable, for example, to provide an improved method where corrections to a mask can be effected after manufacture of the mask.

According to an aspect of the invention, there is provided a lithographic apparatus, comprising: an illumination system configured to provide a radiation beam; a mask support configured to support a mask bearing a pattern and to position the mask in the radiation beam so as to impart the pattern thereto; a projection system configured to project the radiation beam patterned by the mask onto a substrate; and a mask correction system configured to controllably and locally alter a property of the mask.

According to an aspect of the invention, there is provided a method of correcting a mask for use in a lithographic device manufacturing method, the method comprising in a lithographic apparatus, locally altering a property of the mask by directing a radiation beam to be incident selectively on a spot on the mask.

According to an aspect of the invention, there is provided a device manufacturing method using a lithographic apparatus, the method comprising: in the lithographic apparatus, locally alternating a property of a mask by directing a first radiation beam to be incident selectively on a spot on the mask; and directing a second radiation beam onto the mask; and projecting the second radiation beam patterned by the mask onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
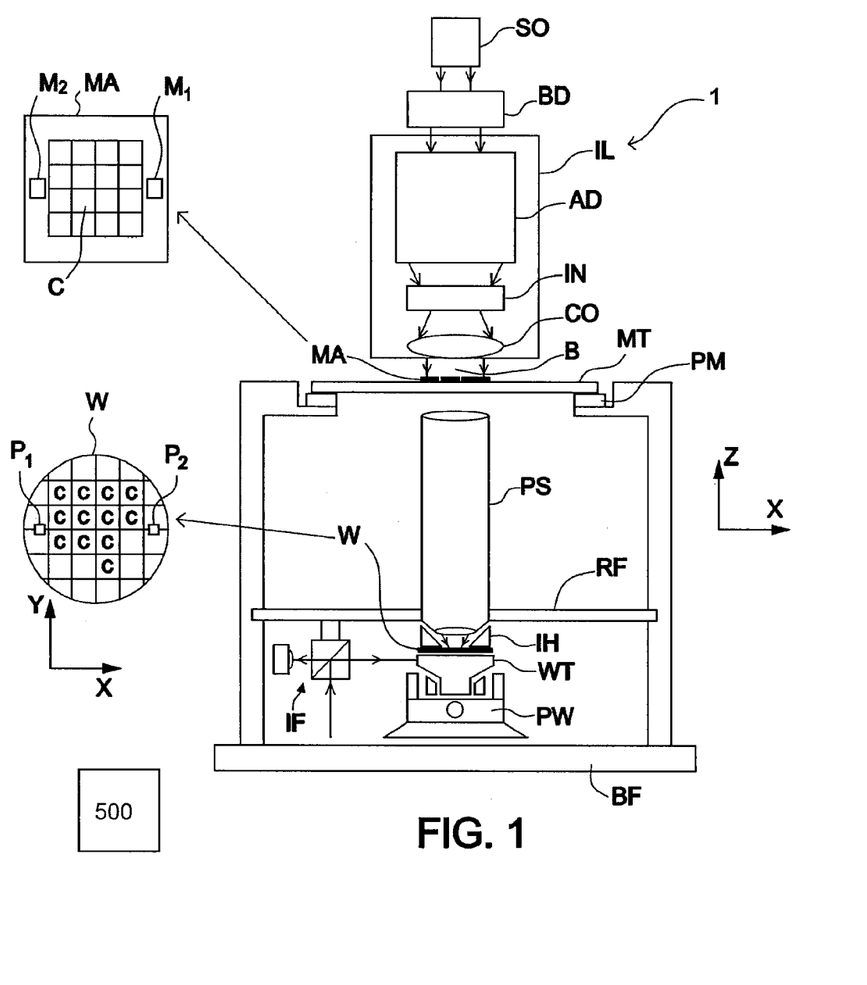
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation, DUV radiation or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing minors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In many lithographic apparatus, a fluid, in particular a liquid for example an immersion liquid, is provided between the final element of the projection system and the substrate using a liquid supply system IH to enable imaging of smaller features and/or increase the effective NA of the apparatus. An embodiment of the invention is described further below with reference to such an immersion apparatus, but may equally be embodied in a non-immersion apparatus. Arrangements to provide liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Anther arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate.

Figure 2:
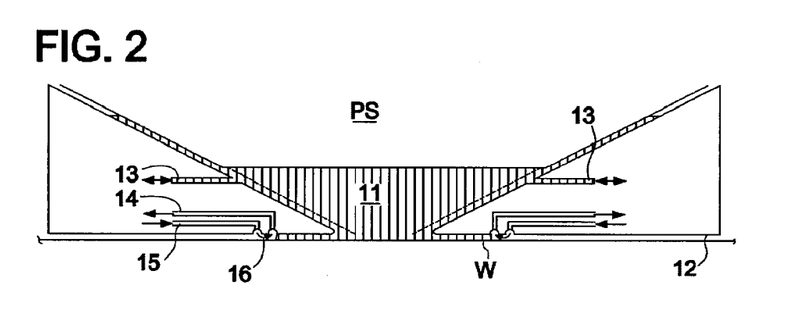
FIG. 2 depicts, in cross-section, a barrier member which may be used in an embodiment of the present invention as an immersion liquid supply system.

An arrangement which has been proposed is to provide the liquid supply system with a liquid confinement member which extends along at least a part of a boundary of the space between the final element of the projection system and the substrate table. Such an arrangement is illustrated in FIG. 2. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 2 schematically depicts a localized liquid supply system with a fluid handling structure 12. The fluid handling structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The fluid handling structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the fluid handling structure 12 and the surface of the substrate W. The gas seal is formed by gas, e.g. air or synthetic air but, in an embodiment, $N_2$ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

Many other types of liquid supply system are possible. The present invention is neither limited to any particular type of liquid supply system, nor to immersion lithography. The invention may be applied equally in any lithography. In an EUV radiation lithography apparatus, the beam path is substantially evacuated and immersion arrangements described above are not used.

A control system 500 controls the overall operations of the lithographic apparatus 1 and in particular performs an optimization process described further below. Control system 500 can be embodied as a suitably-programmed general purpose computer comprising a central processing unit and volatile and/or non-volatile storage. The control system may include one or more input and output devices such as a keyboard and screen, one or more network connections and one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can be configured to be subordinate to a supervisory control system of a lithocell or cluster and/or an overall control system of a fab.

Figure 3:
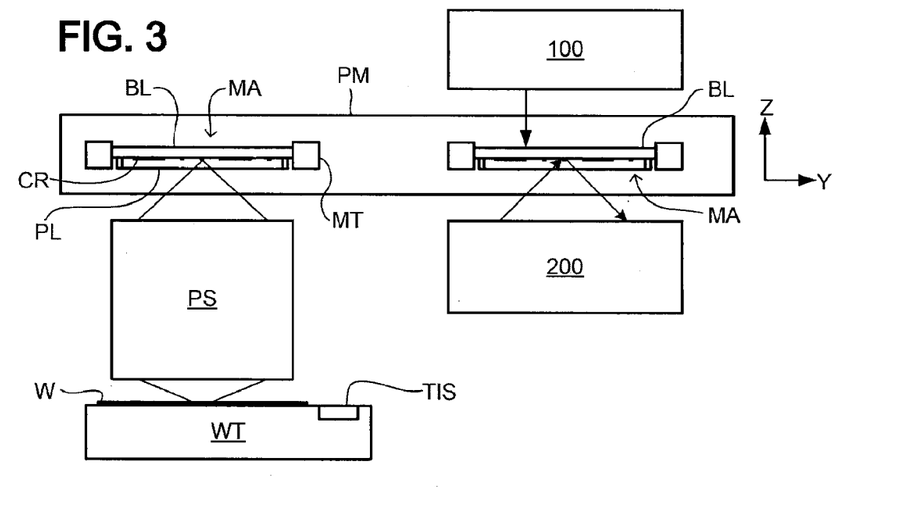
FIG. 3 depicts selected parts of a lithographic apparatus according to an embodiment of the invention.

FIG. 3 depicts a transmissive mask MA (as an example of a patterning device) comprising a substantially transmissive substrate BL, generally referred to as a mask blank, on or in which a pattern CR (typically substantially opaque) is formed, commonly in a chrome layer CR. A mask is typically fabricated for each layer of a device to be manufactured meaning that 30 or 40 masks may be required to manufacture a single device. This number can increase if critical layers are to be formed using double patterning techniques, using two masks per layer. Thus, the manufacture of a mask set for a device represents a substantial investment. A method and mechanism of correcting or adjusting a mask that is cheaper and/or quicker than manufacturing a new mask is desirable. An embodiment of the present invention provides a mask correction device and method in the lithographic apparatus that controllably and locally alters one or more properties of the mask. In this way, the effect of an undesirable and uncontrollable pattern distortion and/or change in the mask when mounted in the lithographic apparatus, e.g. a distortion of the mask due to mask clamping, can be corrected for.

As discussed above, it has been proposed to use an ultrafast femto-second laser to write intra-volume shading elements inside the bulk material of the mask blank in order to adjust the radiation transmission through the mask. This approach can be used to correct for CD uniformity errors within a field but does not correct for other issues. For example, it is desirable to correct a pattern distortion, in particular to correct the position of a feature, and/or a mask distortion. A mask distortion can include a distortion caused by mask clamping, attachment of the pellicle PL and/or the projection system.

In an embodiment of the invention, a mask correction device 100 is provided in the lithographic apparatus at mask level; this is depicted in FIG. 3. The second positioner PM scans the mask MA held on the mask table MT in the object field of the projection system PS for scanned exposures of the substrate W. The second positioner PM also transfers the mask table MT to a second position or station at which the mask MA may be loaded and unloaded and inspected by a mask inspection device 200. The mask inspection device 200 inspects the mask for defects and/or for the presence of particles, e.g. dust. The mask correction device 100 is conveniently located in the same section of the lithographic apparatus as the mask inspection device 200. The second positioner PM scans the mask in front of the mask correction device 100 in at least one direction, e.g. the Y direction. The mask correction device 100 directs an intense beam of radiation onto the mask blank BL and/or pattern CR (for example, where the pattern in partially or substantially transparent) so as to locally alter a property thereof in order to correct the mask pattern. An image sensor TIS is provided on the substrate table WT to measure the position in these orthogonal directions (e.g. X, Y, Z) of projected images of features (e.g. alignment or overlay markers) of the mask. Suitable images sensors, e.g. transmission image sensors, are known in the art.

In an embodiment of the invention, the mask correction device locally alters the geometry of the mask blank and/or pattern in order to minutely adjust the position of element or parts of elements of the pattern. The geometry of the mask blank and/or pattern can be altered by inducing thermal expansion. Due to hysteresis, the mask blank and/or pattern does not return to exactly the same shape as it had initially. In an embodiment, polarized radiation is used to cause differential expansion in two orthogonal directions. This allows finer control of the position of elements of the pattern. Alternatively or in addition, the irradiation of the mask can be used to alter other properties of the mask, including transmissivity to the radiation of the illumination beam, transmissivity to one or more particular polarization states of the illumination beam, and birefringence. In an embodiment, the mask correction device locally changes the optical density of the mask by applying radiation of controllable polarization. In an embodiment, the mask correction device has a depth of focus less than the thickness of the mask blank, desirably less than half the thickness of the mask blank, and is configured to vary the position of the focal point of the intense beam of radiation in a direction perpendicular to the mask surface. In this way, different effects can be achieved at different positions in the thickness of the mask.

Figure 4:
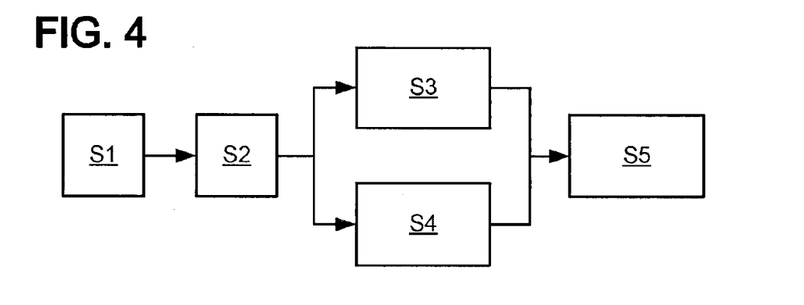
FIG. 4 depicts a method according to an embodiment of the invention.

A method according to an embodiment of the invention is depicted in FIG. 4. First the mask is loaded S1 onto the mask table and clamped thereto. The clamp may be used for fine position control and to restrain the mask during high acceleration but can sometimes introduce distortion into the mask. The clamp can be a mechanical clamp, a vacuum clamp or an electrostatic clamp, for example. The mask pattern is then measured S2 to determine if there is a distortion. Desirably, the mask pattern is measured by projecting an image of it as for exposure of substrates and measuring the projected image at substrate level, e.g. using an image sensor integrated into the substrate table. Alternatively, a test substrate can be exposed and measurements taken of the pattern exposed in resist or transferred into the substrate. In an embodiment, the distortion of the mask pattern is characterized by measuring overlay markers and/or by measuring the relative positions of alignment markers. In an embodiment, determination of the distortion to be corrected is a two step process. In one step, the positions of features, e.g. alignment or overlay markers, on the mask are measured directly on the mask. In another step, the positions of images of features, e.g. alignment or overlay markers, projected by the projection system are measured at substrate level. In this way, distortion of the mask itself in situ can be distinguished from distortion introduced by the projection system.

In step S3, the results of the mask measurements are used to adjust relevant controls of the lithographic apparatus, e.g. magnification, to make whole-field and inter-field corrections. In parallel (or sequentially) the mask correction device is used S4 to effect any necessary or desirable intra-field corrections. Once all corrections are effected, production substrates are exposed S5. By effecting the mask correction in the lithographic apparatus, the effect of mask distortion caused by the mask clamp and/or distortion introduced by the projection system can be taken into account. In an embodiment, the variable controls of the lithographic apparatus are used in step S3 to correct for relatively low spatial-frequency distortion and the mask correction device is used in step S4 to correct for relatively high spatial-frequency distortion. The cut-off between low and high spatial-frequency will depend on the implementation and in particular the effects of the available controls of the lithographic apparatus. In an embodiment, fifth and lower order effects are corrected for by adjustment of the projection system and/or dynamics of the substrate and/or mask table. Higher order effects are corrected by the mask correction device. In an embodiment, a feed-forward correction is made to the correction applied in step S3 based on the predicted results of the corrections to be applied by the mask correction device in step S3.

Figure 5:
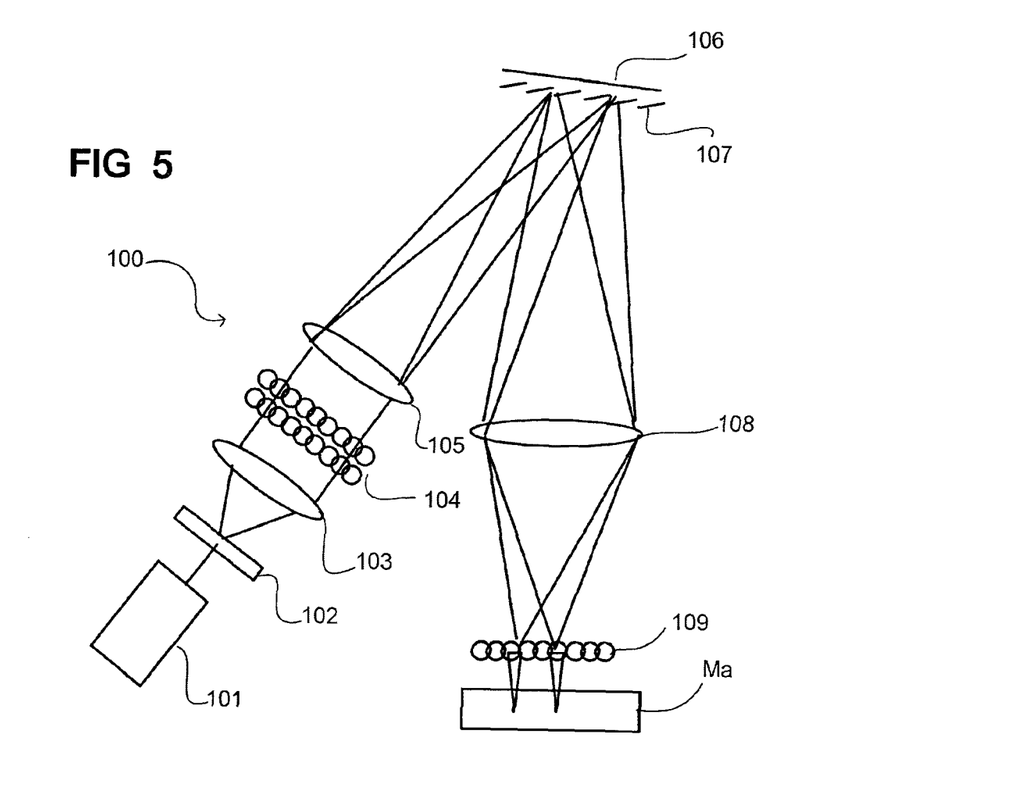
FIG. 5 depicts a mask correction device according to an embodiment of the invention.

Details of the mask correction device 100 are depicted in FIG. 5. A beam expander 101, whose output is collimated by first lens 103, is illuminated by a radiation source 101, e.g. a high output femto-second pulsed laser, which may be separate from the mask correction device 100. A first microlens array 104 forms an array of sub-beams which are projected via a lens 105 onto a spatial light modulator (SLM) 106, e.g. an array of movable mirrors 107. Each sub-beam is projected onto a respective element of the SLM. The controllable elements 107 (e.g., mirrors) of SLM 106 are individually switchable between a first arrangement (e.g., position) in which the respective sub-beam is directed into projection optics 108 and a second arrangement (e.g., position) in which the respective sub-beam is directed to a beam stop (not shown). Projection optics 108 project the sub-beams onto a second microlens array 109 which forms a two dimensional array of spots on the mask MA. The number of spots in the array is desirably chosen to maximize the speed at which mask corrections can be made, depending on the source power and the amount of energy required to effect a desired alteration in a mask property. In an embodiment, there are at least 16 spots in each row of the array, desirably at least 32, more desirably at least 64, yet more desirably at least 128. In an embodiment there are at least 8 rows, desirably at least 16, more desirably at least 32.

Figure 6:
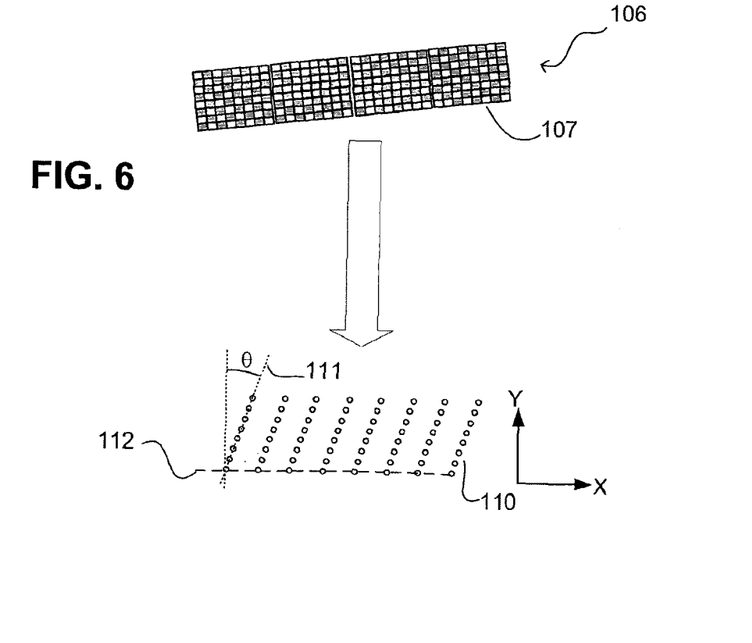
FIG. 6 illustrates an imaging principle used in an embodiment of the invention.

FIG. 6 shows how the rows and columns of the array may be angled to help obtain full coverage of the mask as it is scanned relative to the device. At least one of the rows 112 and columns 111 of the array 110 of spots make an acute angle θ to the scan direction e.g. Y. The value of angle θ depends on the row and column spacings and the size of the beam spots. This approach is known as pixel grid imaging and has been proposed for so-called maskless lithography. By writing multiple spots substantially simultaneously, the scan speed can be multiplied accordingly, enabling a mask correction to be effected in a lithographic apparatus without undue loss of exposure time.

To effect differential alteration of a mask property, a polarizer (not shown) can be interposed into selected ones or all of the sub-beams. The polarizer can impart a linear polarization state, e.g. X or Y. A retarder can be provided to change the polarization state. Use of a polarizer might require additional scans. Alternatively, a movable mirror device can be used in which each mirror can direct radiation selectively to two or more spots in the array. Orthogonal polarizers are placed, one in the beam path of half the sub-beams, enabling each spot to be selectively written to with one or both polarization states.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Embodiments of the invention may further be described using the following clauses:

1. A lithographic apparatus, comprising:
    a mask support configured to support a mask bearing a pattern and to position the mask in a radiation beam so as to impart the pattern to the radiation beam;
    a projection system configured to project the radiation beam patterned by the mask onto a substrate; and
    a mask correction system configured to controllably and locally alter a property of the mask.

2. The lithographic apparatus of clause 1, wherein the mask correction system is configured to locally alter one or more properties of the mask selected from the group consisting of: transmissivity to the radiation beam; transmissivity to a polarization state of the radiation beam; birefringence; and geometry.

3. The lithographic apparatus of clause 1 or clause 2, wherein the mask correction system comprises a focusing optical system configured to direct a second radiation beam on to a spot on the mask so that the property of the mask is locally altered.

4. The lithographic apparatus of clause 3, wherein the mask correction system is configured to direct second radiation onto a plurality of spots on the mask substantially simultaneously.

5. The lithographic apparatus of clause 4, wherein the mask support comprises a positioner configured to scan the mask relative to the mask correction system in a first direction.

6. The lithographic apparatus of clause 5, wherein the positioner is further configured to scan the mask in the first direction when the mask is positioned in the radiation beam.

7. The lithographic apparatus of any of clauses 4 to 6, wherein the plurality of spots are arranged in a two-dimensional array, at least either rows or columns of the two-dimensional array of spots forming an acute angle to the first direction.

8. The lithographic apparatus of any of clauses 4 to 7, wherein the focusing optical system comprises:
    a beam divider to divide the second radiation beam into a plurality of sub-beams to be incident on the mask at respective spaced apart spots; and
    a beam director to selectively direct each of the sub-beams to respective spots on the mask.

9. The lithographic apparatus of clause 8, wherein the beam divider comprises a microlens array and the beam director comprises an array of movable mirrors, each microlens of the microlens array being arranged to focus a sub-beam on a respective one of the movable mirrors.

10. The lithographic apparatus of clause 9, wherein each movable mirror is movable between a first position at which a respective one of the sub-beams is directed to be incident on a respective spot on the mask and a second position at which the respective one of the sub-beams is directed to not be incident on the mask.

11. The lithographic apparatus of clause 9, wherein each movable mirror is movable between a plurality of positions at each of which a respective one of the sub-beams is directed to be incident on a respective spot on the mask.

12. The lithographic apparatus of any of clauses 3 to 11, wherein the focusing optical system comprises a radiation source configured to provide the second radiation beam.

13. The lithographic apparatus of any of clauses 3 to 11, wherein the mask correction device further comprises a controllable polarizer arranged to selectively impart a desired polarization state to the second radiation beam.

14. The lithographic apparatus of clause 13, wherein the controllable polarizer comprises a polarizer and a switching device arranged to selectively move the polarizer into and out of the second radiation beam.

15. The lithographic apparatus of any of clauses 1 to 14, further comprising a mask inspection device and wherein the mask correction device is configured to change the mask when the mask is in a position to be inspected by the mask inspection device.

16. A method of correcting a mask for use in a lithographic device manufacturing method, the method comprising:

in a lithographic apparatus, locally altering a property of the mask by directing a radiation beam to be incident selectively on a spot on the mask.

17. The method of clause 16, wherein the property of the mask that is locally altered by the radiation beam is one or more selected from the group consisting of: transmissivity to a second radiation beam used in the lithographic device manufacturing method; transmissivity to a polarization state of the second radiation beam; birefringence; and geometry.

18. The method of clause 16 or clause 17, wherein directing comprises directing the radiation beam onto a plurality of spots on the mask substantially simultaneously.

19. The method of clause 18, further comprising scanning the mask relative to the radiation beam in a first direction while performing the directing.

20. The method of clause 18 or clause 19, wherein the plurality of spots are arranged in a two-dimensional array, at least either rows or columns of the two-dimensional array of spots forming an acute angle to the first direction.

21. The method of any of clauses 16 to 20, further comprising selectively imparting a desired polarization state to the radiation beam.

22. The method of any of clauses 16 to 21, further comprising:
before directing the radiation beam and in the lithographic apparatus, projecting an image of the mask and measuring a value of a property of the image, wherein the altering is responsive to the measured value.

23. The method of clause 22, wherein measuring a value of a property of the image comprises measuring the position of a marker in the image.

24. The method of clause 23, wherein measuring the position of a marker is performed using an image sensor integrated into the lithographic apparatus.

25. The method of clause 23, wherein measuring the position of a marker comprises:
exposing a radiation-sensitive layer of a substrate to the image of the mask; and
measuring the position of the marker in the radiation-sensitive layer.

26. The method of any of clauses 23 to 25, wherein the marker is one or more selected from the group consisting of: an alignment marker and an overlay marker.

27. The method of any of clauses 22 to 26, further comprising repeating the projecting and measuring after the altering.

28. A device manufacturing method using a lithographic apparatus, the method comprising:
in the lithographic apparatus, locally altering a property of a mask by directing a first radiation beam to be incident selectively on a spot on the mask;
directing a second radiation beam onto the mask; and
projecting the second radiation beam patterned by the mask onto a substrate.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a mask support configured to support a mask bearing a pattern and to position the mask in a first radiation beam so as to impart the pattern to the first radiation beam;
a projection system configured to project the first radiation beam patterned by the mask onto a substrate; and
a mask correction system configured to controllably and locally deform material constituting part of, or alter a materials property within, the integral physical structure of the mask for use of the mask having the locally deformed material or altered property in patterning of the first radiation beam, wherein the mask correction system comprises a focusing optical system configured to direct a second radiation beam to the mask so that the property of the mask is locally altered by the second radiation beam.

2. The lithographic apparatus of claim 1, wherein the mask correction system is configured to locally alter one or more properties of the mask selected from the group consisting of: transmissivity to the radiation beam; transmissivity to a polarization state of the radiation beam; birefringence; and geometry.

3. The lithographic apparatus of claim 1, wherein the mask correction system is configured to direct second radiation onto a plurality of spots on the mask substantially simultaneously.

4. The lithographic apparatus of claim 3, wherein the mask support comprises a positioner configured to scan the mask relative to the mask correction system in a first direction.

5. The lithographic apparatus of claim 4, wherein the positioner is further configured to scan the mask in the first direction when the mask is positioned in the radiation beam.

6. The lithographic apparatus of claim 3, wherein the plurality of spots are arranged in a two-dimensional array, at least either rows or columns of the two-dimensional array of spots forming an acute angle to the first direction.

7. The lithographic apparatus of claim 3, wherein the focusing optical system comprises:
a beam divider to divide the second radiation beam into a plurality of sub-beams to be incident on the mask at respective spaced apart spots; and
a beam director to selectively direct each of the sub-beams to respective spots on the mask.

8. The lithographic apparatus of claim 7, wherein the beam divider comprises a microlens array and the beam director comprises an array of movable mirrors, each microlens of the microlens array being arranged to focus a sub-beam on a respective one of the movable mirrors.

9. The lithographic apparatus of claim 8, wherein each movable mirror is movable between a first position at which a respective one of the sub-beams is directed to be incident on a respective spot on the mask and a second position at which the respective one of the sub-beams is directed to not be incident on the mask.

10. The lithographic apparatus of claim 8, wherein each movable mirror is movable between a plurality of positions at each of which a respective one of the sub-beams is directed to be incident on a respective spot on the mask.

11. The lithographic apparatus of claim 1, wherein the focusing optical system comprises a radiation source configured to provide the second radiation beam.

12. The lithographic apparatus of claim 1, wherein the mask correction device further comprises a controllable polarizer arranged to selectively impart a desired polarization state to the second radiation beam.

13. The lithographic apparatus of claim 12, wherein the controllable polarizer comprises a polarizer and a switching device arranged to selectively move the polarizer into and out of the second radiation beam.

14. The lithographic apparatus of claim 1, further comprising a mask inspection device and wherein the mask correction device is configured to change the mask when the mask is in a position to be inspected by the mask inspection device.

15. A method of correcting a mask for use in a lithographic device manufacturing method, the method comprising:

in a lithographic apparatus, directing a first radiation beam to be incident selectively on a spot on the mask to locally deform material constituting part of, or alter a materials property within, the integral physical structure of the mask for use of the mask having the locally deformed material or altered property in patterning of a second radiation beam.

16. The method of claim 15, wherein the property of the mask that is locally altered by the first radiation beam is one or more selected from the group consisting of: transmissivity to the second radiation beam used in the lithographic device manufacturing method; transmissivity to a polarization state of the second radiation beam; birefringence; and geometry.

17. The method of claim 15, wherein directing comprises directing the first radiation beam onto a plurality of spots on the mask substantially simultaneously.

18. The method of claim 17, further comprising scanning the mask relative to the first radiation beam in a first direction while performing the directing.

19. A device manufacturing method using a lithographic apparatus, the method comprising:

in the lithographic apparatus, directing a first radiation beam to be incident selectively on a spot on a mask to locally deform material constituting part of, or alter a materials property within, the integral physical structure of the mask;

directing a second radiation beam onto the mask; and projecting the second radiation beam patterned by the mask having the locally deformed material or altered property onto a substrate.

20. The method of claim 19, wherein directing the first radiation beam comprises directing the first radiation beam onto a plurality of spots on the mask substantially simultaneously.

* * * * *